US010788553B2

(12) United States Patent
Asano et al.

(10) Patent No.: US 10,788,553 B2
(45) Date of Patent: Sep. 29, 2020

(54) NUCLEAR MAGNETIC RESONANCE APPARATUS

(71) Applicant: JEOL Ltd., Tokyo (JP)

(72) Inventors: Hiroyasu Asano, Tokyo (JP); Takeshi Tukada, Tokyo (JP)

(73) Assignee: JEOL Ltd., Tokyo (JP)

( * ) Notice: Subject to any disclaimer, the term of this patent is extended or adjusted under 35 U.S.C. 154(b) by 252 days.

(21) Appl. No.: 15/936,926

(22) Filed: Mar. 27, 2018

(65) Prior Publication Data

US 2018/0284206 A1  Oct. 4, 2018

(30) Foreign Application Priority Data

Mar. 28, 2017 (JP) ................. 2017-062994

(51) Int. Cl.
*G01R 33/3875* (2006.01)
*G01R 33/389* (2006.01)
*G01R 33/46* (2006.01)
*G01R 33/36* (2006.01)

(52) U.S. Cl.
CPC ....... *G01R 33/3875* (2013.01); *G01R 33/389* (2013.01); *G01R 33/4616* (2013.01); *G01R 33/3635* (2013.01)

(58) Field of Classification Search
None
See application file for complete search history.

(56) References Cited

U.S. PATENT DOCUMENTS

| 6,222,365 B1* | 4/2001 | Taniguchi | G01R 33/482 324/307 |
| 2013/0234706 A1* | 9/2013 | Mandal | G01N 24/081 324/303 |
| 2017/0089992 A1* | 3/2017 | Sakakibara | G01R 33/3873 |

FOREIGN PATENT DOCUMENTS

JP  201025896 A  2/2010

* cited by examiner

*Primary Examiner* — Paresh Patel
(74) *Attorney, Agent, or Firm* — The Webb Law Firm

(57) ABSTRACT

A transmission signal generator generates a lock transmission signal that excites a lock nucleus (deuteron) used for observing a change of a static magnetic field. A LOCK transmission circuit transmits the lock transmission signal to an NMR probe. A LOCK reception circuit receives an NMR signal of the lock nucleus. A LOCK transmission sequencer, based on a pulse sequence generated according to at least one of amplitude modulation, frequency modulation, or phase modulation, controls generation of the lock transmission signal performed by the transmission signal generator.

7 Claims, 13 Drawing Sheets

NUCLEAR MAGNETIC RESONANCE APPARATUS

CROSS-REFERENCE TO RELATED APPLICATION

This application claims priority to Japanese Patent Application No. 2017-062994 filed Mar. 28, 2017, the disclosure of which is hereby incorporated in its entirety by reference.

BACKGROUND OF THE INVENTION

Field of the Invention

The present disclosure relates to a nuclear magnetic resonance apparatus, and more particularly to a technique for controlling transmission and reception of signals for observing change in the static magnetic field.

Description of Related Art

Known magnetic resonance measurement apparatuses include nuclear magnetic resonance (NMR) measurement apparatuses and electron spin resonance (ESR) measurement apparatuses. Magnetic resonance imaging (MRI) apparatuses similar to NMR measurement apparatuses are also known. The NMR measurement apparatuses will be described.

An NMR measurement apparatus irradiates a sample placed in a static magnetic field with high-frequency signals and thereafter detects minute high-frequency signals (NMR signals) emanated from the sample. The NMR measurement apparatus then extracts molecular structure information contained in the NMR signals to analyze the molecular structure.

In NMR measurements, more uniform static magnetic field typically results in a spectrum having higher resolution and sensitivity. Therefore, a typical NMR measurement apparatus includes, as an auxiliary coil, a shim coil to be placed near a sample, and controls the amount of shim current flowing through the shim coil, thereby keeping the static magnetic field uniform.

In a method that is typically adopted to maintain the uniform static magnetic field, the amount of the shim current flowing in the shim coil is gradually varied in accordance with a change of the static magnetic field to track the resolution of NMR signals to be observed. This method is called "lock." The NMR signals used for this purpose are typically NMR signals (lock reception signals) of deuteron ($^2$H nucleus) originated from a deuterated solvent in a sample.

Highly uniform static magnetic field increases the device resolution to thereby decrease the line width of a lock reception signal, resulting in an increased signal height. In other words, there is a correlation between the height of a lock reception signal and the device resolution: the higher the lock reception signal height, the higher the device resolution.

To perform lock operations described above, an NMR measurement apparatus includes a lock transmission and reception circuit. The lock transmission and reception circuit transmits to an NMR probe a lock transmission signal that excites deuteron (lock nucleus) used for observing a change of the static magnetic field, and receives a deuteron NMR signal (lock reception signal). The deuteron NMR signal (lock reception signal) is monitored and the amount of shim current flowing in the shim coil is controlled such that the intensity of the NMR signal is maximized (see JP 2010-025896 A).

Conventional lock transmission and reception circuits merely repeat transmission of lock transmission signals and reception of lock reception signals at fixed time intervals, and do not perform signal transmission and reception in accordance with various different usages.

SUMMARY OF THE INVENTION

An embodiment of this disclosure is directed toward a nuclear magnetic resonance apparatus including a lock transmission and reception circuit, capable of controlling transmission and reception performed by the lock transmission and reception circuit in accordance with usages.

In accordance with an aspect of the disclosure, a nuclear magnetic resonance (NMR) apparatus includes a lock transmission and reception circuit, and a lock sequencer connected with the lock transmission and reception circuit. The lock transmission and reception circuit is configured to transmit to an NMR probe a lock transmission signal that excites a lock nucleus used for observing a change in a static magnetic field for nuclear magnetic resonance measurement and to receive from the NMR probe an NMR signal of the lock nucleus. The lock sequencer is configured to control generation of the lock transmission signal based on a pulse sequence generated according to at least one of amplitude modulation, frequency modulation, or phase modulation.

This structure uses the lock sequencer to execute at least one of amplitude modulation, frequency modulation, or phase modulation to enable generation and transmission of lock transmission signals in accordance with usage. This structure therefore increases the degree of freedom of the nuclear magnetic resonance apparatus.

The lock transmission signal may be a pulsed signal, and the lock sequencer may control application of amplitude modulation to the lock transmission signal to blunt a rising portion and a falling portion of the lock transmission signal.

This structure may gently change the amplitude in the rising portion and the falling portion of the lock transmission signals. This can narrow the spectrum band of the lock transmission pulse, thereby reducing unnecessary signals resulting from the lock operation.

The lock sequencer may variably control the transmission timing for transmitting the lock transmission signals. The lock sequencer may vary the transmission timing in accordance with usage, for example.

The lock transmission and reception circuit may include a lock transmission circuit configured to transmit the lock transmission signal, via a transmission and reception switching circuit, to the NMR probe and a lock reception circuit configured to receive an NMR signal of the lock nucleus from the NMR probe via the transmission and reception switching circuit. The transmission and reception switching circuit may be a switch configured to change a connection target between a transmission instance and a reception instance by connecting the lock transmission circuit with the NMR probe during the transmission instance and connecting the lock reception circuit with the NMR probe during the reception instance. The lock sequencer may vary the transmission timing for each lock transmission signal.

This structure diffuses noise resulting from the switching to distribute the frequency components of the unnecessary signals, thereby reducing the noise caused by the lock operation.

The lock sequencer may set a waiting period after a reception period of the NMR signal of the lock nucleus and control the lock transmission circuit to transmit the lock transmission signal after the waiting period. The lock sequencer may change the waiting period for each transmission instance of transmitting the lock transmission signal.

This structure changes the waiting period for each transmission of the lock transmission signals, thereby enabling distribution of the noise resulting from the switching.

The lock sequencer may change a length of the waiting period randomly for each transmission instance of transmitting the lock transmission signal.

The lock sequencer may change the transmission timing for transmitting the lock transmission signal for each lock transmission signal when spread frequency is applied to a system clock of the lock sequencer.

The lock sequencer may further control transmission of transmission signals including wideband pulses.

The lock sequencer may further control transmission of transmission signals for decoupling.

The present disclosure enables a nuclear magnetic resonance apparatus including a lock transmission and reception circuit to control transmission and reception performed by the lock transmission and reception circuit in accordance with usages.

BRIEF DESCRIPTION OF THE DRAWINGS

Embodiments of the present disclosure will be described with reference to the following figures, wherein.

DESCRIPTION OF THE INVENTION

Figure 1:
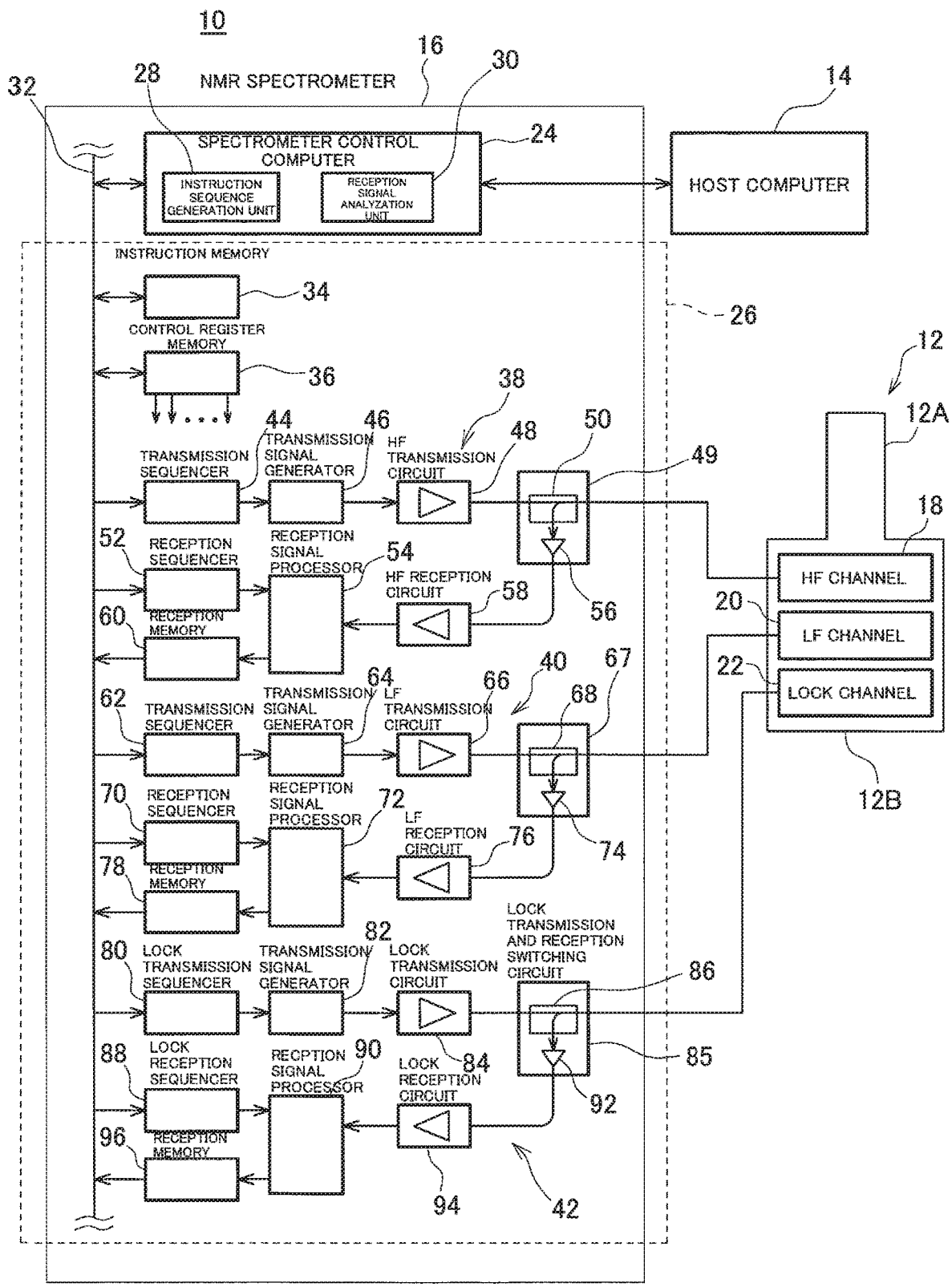
FIG. 1 is a block diagram illustrating an NMR measurement apparatus according to an embodiment of the disclosure.

Embodiments of an NMR measurement apparatus of the disclosure will be described. FIG. 1 illustrates an example NMR measurement apparatus according to an embodiment. An NMR measurement apparatus 10 measures NMR signals generated from an observation nucleus in a sample.

The NMR measurement apparatus 10 roughly includes a static magnetic field generation apparatus, which is not shown, an NMR probe 12, a host computer 14, and an NMR spectrometer 16.

The NMR probe 12 includes an insertion member 12A including a transmission and reception coil that is not shown, and a housing member 12B corresponding to a base portion of the NMR probe 12. In NMR measurement, NMR measurement high-frequency signals (RF transmission signals) are generated and supplied to the transmission and reception coil within the NMR probe 12. In the example illustrated in FIG. 1, the NMR probe 12 has three ports, and receives three RF transmission signals. An NMR probe having a single port or two or more ports may also be used. The insertion member 12A has a cylindrical shape and is configured to be inserted into a cylindrical bore formed in the static magnetic field generation apparatus that is not shown. Receiving the RF transmission signals, the transmission and reception coil generates electromagnetic waves, which causes a resonance absorption phenomenon in an observation nucleus. Thereafter, NMR signals (RF reception signals) induced by the transmission and reception coil are transmitted from the NMR probe 12 to the NMR spectrometer 16 for analyzing the spectrum of the NMR signals.

The NMR probe 12 includes, as the three ports, an observation channel 18 (HF channel) for mainly measuring a hydrogen nucleus ($^1$H nucleus) and a fluorine nucleus ($^{19}$F nucleus), an observation channel 20 (LF channel) for measuring a nucleus having a resonance frequency that is equal to or lower than a resonance frequency of a phosphorus nucleus ($^{31}$P nucleus), such as $^{13}$C nucleus, $^{15}$N nucleus, $^{29}$Si nucleus, or $^{31}$P nucleus, for example, and an observation channel 22 (LOCK channel) for measuring deuteron ($^2$H nucleus) as a lock nucleus.

The host computer 14 generates a pulse sequence program that describes pulse sequences for implementing desired NMR measurement. The pulse sequence may be generated automatically or by a user. The pulse sequence program is transmitted from the host computer 14 to a spectrometer control computer 24 of the NMR spectrometer 16. The host computer 14 may be a general personal computer.

The spectrometer control computer 24 controls operation of a transmission and reception unit 26 described below, and analyzes reception data obtained from the transmission and reception unit 26. The spectrometer control computer 24 includes an instruction sequence generation unit 28 that converts the pulse sequence program to an instruction sequence. The instruction sequence generation unit 28 is formed as a complier, for example. The instruction sequence generation unit 28 generates an instruction sequence for controlling the transmission and reception unit 26 and transmits the instruction sequence to the transmission and reception unit 26. Alternatively, the transmission and reception unit 26 may analyze the pulse sequence program to generate the instruction sequence. Further, the spectrometer control computer 24 may generate an intermediate instruction sequence having a compressed structure, for example, and transfer the intermediate instruction sequence to the transmission and reception unit 26 where the intermediate instruction sequence is developed to reconstruct an uncompressed instruction sequence. In particular, it is desirable to adopt the compressed intermediate instruction sequence as described above to address disadvantages caused by the transfer rate (data amount) during data transfer.

The spectrometer control computer 24 further includes a reception signal analysis unit 30. The reception signal analysis unit 30 has an FFT computation function to execute spectrum analysis of the NMR signal (RF reception signal). The spectrometer control computer 24 has, in addition to the spectrum analysis function, a control function, an analysis function, and a management function necessary for NMR measurement.

The spectrometer control computer 24 is connected, via a communication bus 32, to the transmission and reception unit 26. In the example illustrated in FIG. 1, the spectrometer control computer 24 is connected to the host computer 14 via a network. The spectrometer control computer 24 may be a dedicated computer or a general computer.

The host computer 14 and the spectrometer control computer 24 may be integrally formed. The apparatus may also include a plurality of spectrometer control computers 24.

Further, a part or all of the functions of the spectrometer control computer 24 may be incorporated in the host computer 14.

The transmission and reception unit 26 will be described hereinafter. The transmission and reception unit 26 generates an RF transmission signal necessary for NMR measurement, and processes an NMR signal (RF reception signal) obtained as a result of the NMR measurement. The transmission and reception unit 26, or a combination of the transmission and reception unit 26 and the spectrometer control computer 24 (NMR spectrometer 16) may be referred to as an NMR measurement apparatus.

An instruction memory 34 stores the instruction sequence transmitted from the spectrometer control computer 24. When the instruction sequence is temporarily converted into an intermediate instruction sequence, for example, a computation processor that is not shown generates (reconstructs) a final instruction sequence from the intermediate instruction sequence. The instruction sequence may be generated by other circuits. The instruction memory 34 includes a plurality of memory regions (e.g., FIFO) for storing the instruction sequences in sequencer units, which will be described below. Each sequencer may include such memory regions.

In the present embodiment, the transmission and reception unit 26 includes, in addition to the instruction memory 34, a control register memory 36. The control register memory 36 includes a register region. Settings are written into the register region.

The transmission and reception unit 26 further includes an HF transmission and reception unit 38, an LF transmission and reception unit 40, and a LOCK transmission and reception unit 42.

The HF transmission and reception unit 38 is connected to the observation channel 18 (HF channel) of the NMR probe 12 for transmitting an RF transmission signal for measuring mainly a hydrogen nucleus ($^1$H nucleus) and a fluorine nucleus ($^{19}$F nucleus) to the observation channel 18 and receiving an NMR signal (RF reception signal).

The LF transmission and reception unit 40 is connected to the observation channel 20 (LF channel) of the NMR probe 12 for transmitting an RF transmission signal for measuring a nucleus having a resonance frequency that is equal to or lower than that of a phosphorus nucleus ($^{31}$P nucleus), such as $^{13}$C nucleus, $^{15}$N nucleus, $^{29}$Si nucleus, and $^{31}$P nucleus, to the observation channel 20 and receiving an NMR signal (RF reception signal).

The LOCK transmission and reception unit 42 is connected to the observation channel 22 (LOCK channel) of the NMR probe 12, for transmitting an RF transmission signal (lock transmission signal) for measuring deuteron ($^2$H nucleus) serving as a lock nucleus to the observation channel 22 and receiving an NMR signal (RF reception signal) as a lock reception signal.

A transmission sequencer 44 in the HF transmission and reception unit 38 controls the operation of a transmission signal generation device, for example, in a transmission signal generator 46. Specifically, the transmission sequencer 44 executes the instruction sequence provided for the transmission sequencer 44 sequentially from the top.

The transmission signal generator 46 includes a signal generation device serving as a transmission signal generation device, a DA converter (DAC), a signal processing circuit, and frequency conversion circuit, for example.

The operation of the signal generation device in the transmission signal generator 46 is basically controlled by the transmission sequencer 44. More specifically, parameter sets that define the operation of the signal generation device are supplied from the transmission sequencer 44 to the signal generation device. The signal generation device includes an NCO (Numerical Controlled Oscillator) that includes a phase accumulator and sine-wave lookup table, for example. The NCO can be used to perform frequency modulation, phase modulation, and amplitude modulation. As such, RF signals (original signals) having been subjected to modulation and other processes independently are generated by the signal generation device. It is possible to determine the frequency of the signals generated by the NCO as desired.

The transmission signal generator 46 generates RF transmission signals for NMR measurement (RF transmission signals for measuring mainly a hydrogen nucleus ($^1$H nucleus) and a fluorine nucleus ($^{19}$F nucleus)). The RF transmission signals, which are analog signals, are transmitted to an HF transmission circuit 48, which adjusts the intensity of the RF transmission signals appropriately. The adjusted RF transmission signals are transmitted, via a T/R switch 50 in an HF transmission and reception switching circuit 49, to the observation channel 18 (HF channel) of the NMR probe 12 and supplied to the transmission and reception coil within the NMR probe 12. In some cases, the RF transmission signals may be mixed with local signals in the HF transmission circuit 48 for frequency conversion.

A reception sequencer 52 within the HF transmission and reception unit 38 has basically the same structure as the structure of the transmission sequencer 44, and executes the instruction sequence provided for the reception sequencer 52 sequentially from the top. The reception sequencer 52 thus controls operations of the circuits provided in a reception signal processor 54.

The transmission and reception coil, receiving the RF transmission signals, generates electromagnetic wave, causing a resonance absorption phenomenon in the observation nucleus. Subsequently, NMR signals (RF reception signals), induced by the transmission and reception coil, are transmitted from the observation channel 18 (HF channel) of the NMR probe 12, via the T/R switch 50 within the HF transmission and reception switching circuit 49, to the reception signal processor 54.

The T/R switch 50 has a routing function to transmit the RF transmission signals to the observation channel 18 (HF channel) of the NMR probe 12 during transmission and to transmit the RF reception signals from the observation channel 18 (HF channel) of the NMR probe 12 to the reception signal processor 54 during reception. The RF reception signal from the T/R switch 50 is amplified by a preamplifier 56. An HF reception circuit 58 adjusts the intensity of the amplified RF reception signals appropriately and transmits the adjusted RF reception signals to the reception signal processor 54. In some cases, the T/R switch 50 does not switch the connection target.

The reception signal processor 54 within the HF transmission and reception unit 38 performs processes including frequency conversion, AD conversion, and quadrature detection, for example, on the input RF reception signals. The processed RF reception signals (complex signals) are temporarily stored in a reception memory 60 as reception data. The reception data read from the reception memory 60 are transmitted to the spectrometer control computer 24, which executes analysis of the reception data. The analysis of the reception data may be performed within the transmission and reception unit 26.

A transmission sequencer 62 in the LF transmission and reception unit 40 controls the operation of a transmission signal generation device, for example, in a transmission signal generator 64. Specifically, the transmission sequencer 62 executes the instruction sequence provided for the transmission sequencer 62 sequentially from the top.

The transmission signal generator 64 includes a signal generation device serving as a transmission signal generation device, a DA converter (DAC), a signal processing circuit, and frequency conversion circuit, for example.

The operation of the signal generation device in the transmission signal generator 64 is basically controlled by the transmission sequencer 62. More specifically, parameter sets that define the operation of the signal generation device are supplied from the transmission sequencer 62 to the signal generation device. The signal generation device includes an NCO (Numerical Controlled Oscillator) that includes a phase accumulator and a sine-wave lookup table, for example. The NCO can be used to perform frequency modulation, phase modulation, and amplitude modulation. As such, RF signals (original signals) having been subjected to modulation and other processes independently are generated by the signal generation device. It is possible to determine the frequency of the signals generated by the NCO as desired.

The transmission signal generator 64 generates RF transmission signals for NMR measurement (RF transmission signals for measuring a nucleus having a resonance frequency that is equal to or lower than the resonance frequency of a phosphorus nucleus ($^{31}P$ nucleus), such as $^{13}C$ nucleus, $^{15}N$ nucleus, $^{29}Si$ nucleus, or $^{31}P$ nucleus). The RF transmission signals, which are analog signals, are transmitted to an LF transmission circuit 66, which adjusts the intensity of the RF transmission signals appropriately. The adjusted RF transmission signals are transmitted, via a T/R switch 68 in an LF transmission and reception switching circuit 67, to the observation channel 20 (LF channel) of the NMR probe 12 and supplied to the transmission and reception coil within the NMR probe 12. In some cases, the RF transmission signals may be mixed with local signals in the LF transmission circuit 66 for frequency conversion.

A reception sequencer 70 within the LF transmission and reception unit 40 has basically the same structure as the structure of the transmission sequencer 62, and executes the instruction sequence provided for the reception sequencer 70 sequentially from the top. The reception sequencer 70 thus controls the operation of the circuits provided in a reception signal processor 72.

The transmission and reception coil, receiving the RF transmission signals, generates electromagnetic waves, causing a resonance absorption phenomenon in the observation nucleus. Subsequently, NMR signals (RF reception signals), induced by the transmission and reception coil, are transmitted from the observation channel 20 (LF channel) of the NMR probe 12, via the T/R switch 68 within the LF transmission and reception switching circuit 67, to the reception signal processor 72.

The T/R switch 68 has a routing function to transmit the RF transmission signals to the observation channel 20 (LF channel) of the NMR probe 12 during transmission and to transmit the RF reception signals from the observation channel 20 (LF channel) of the NMR probe 12 to the reception signal processor 72 during reception. The RF reception signal from the T/R switch 68 is amplified by a preamplifier 74. An LF reception circuit 76 adjusts the intensity of the amplified RF reception signals appropriately and transmits the adjusted RF reception signals to the reception signal processor 72. In some cases, the T/R switch 68 does not switch the connection target.

The reception signal processor 72 within the LF transmission and reception unit 40 performs processes including frequency conversion, AD conversion, and quadrature detection, for example, on the input RF reception signals. The processed RF reception signals (complex signals) are temporarily stored in a reception memory 78 as reception data. The reception data read from the reception memory 78 are transmitted to the spectrometer control computer 24, which executes analysis of the reception data. The analysis of the reception data may be performed within the transmission and reception unit 26.

A LOCK transmission sequencer 80 in the LOCK transmission and reception unit 42 controls the operation of a transmission signal generation device, for example, in a transmission signal generator 82. Specifically, the LOCK transmission sequencer 80 executes the instruction sequence provided for the LOCK transmission sequencer 80 sequentially from the top.

The transmission signal generator 82 includes a signal generation device serving as a transmission signal generation device, a DA converter (DAC), a signal processing circuit, and a frequency conversion circuit, for example.

The operation of the signal generation device in the transmission signal generator 82 is basically controlled by the LOCK transmission sequencer 80. More specifically, parameter sets that define the operation of the signal generation device are supplied from the LOCK transmission sequencer 80 to the signal generation device. The signal generation device includes an NCO (Numerical Controlled Oscillator) that includes a phase accumulator and a sine-wave lookup table, for example. The NCO can be used to perform frequency modulation, phase modulation, and amplitude modulation. As such, RF signals (original signals) having been subjected to modulation and other processes independently are generated by the signal generation device. It is possible to determine the frequency of the signals generated by the NCO as desired.

The transmission signal generator 82 generates RF transmission signals for NMR measurement (RF transmission signals for measuring deuteron ($^{2}H$ nucleus)). The RF transmission signals, which are analog signals, are transmitted to a LOCK transmission circuit 84, which adjusts the intensity of the RF transmission signals appropriately. The adjusted RF transmission signals are transmitted, via a T/R switch 86 in a LOCK transmission and reception switching circuit 85, to the observation channel 22 (LOCK channel) of the NMR probe 12 and supplied to the transmission and reception coil within the NMR probe 12. In some cases, the RF transmission signals may be mixed with local signals in the LOCK transmission circuit 84 for frequency conversion.

A LOCK reception sequencer 88 within the LOCK transmission and reception unit 42 has basically the same structure as that of the LOCK transmission sequencer 80, and executes the instruction sequence provided for the LOCK reception sequencer 88 sequentially from the top. The LOCK reception sequencer 88 thus controls the operations of the circuits provided in a reception signal processor 90.

The transmission and reception coil, receiving the RF transmission signals, generates electromagnetic waves, causing a resonance absorption phenomenon in the observation nucleus. Subsequently, NMR signals (RF reception signals), induced by the transmission and reception coil, are transmitted from the observation channel 22 (LOCK channel) of the NMR probe 12, via the T/R switch 86 within the LOCK transmission and reception switching circuit 85, to the reception signal processor 90.

The T/R switch 86 has a routing function to transmit the RF transmission signals to the observation channel 22 (LOCK channel) of the NMR probe 12 during transmission and to transmit the RF reception signals from the observation channel 22 (LOCK channel) of the NMR probe 12 to the reception signal processor 90 during reception. The RF reception signals from the T/R switch 86 are amplified by a preamplifier 92. A LOCK reception circuit 94 adjusts the intensity of the amplified RF reception signals appropriately and transmits the adjusted RF reception signals to the reception signal processor 90. In some cases, the T/R switch 86 does not switch the connection target.

The reception signal processor 90 within the LOCK transmission and reception unit 42 performs processes including frequency conversion, AD conversion, and quadrature detection, for example, on the input RF reception signals. The processed RF reception signals (complex signals) are temporarily stored in a reception memory 96 as reception data. The reception data read from the reception memory 96 are transmitted to the spectrometer control computer 24, which executes analysis of the reception data. The analysis of the reception data may be performed within the transmission and reception unit 26.

Further, the insertion member 12A of the NMR probe 12 includes a shim coil, which is not shown, near the sample. The amount of shim current flowing through the shim coil is controlled such that the intensity of the lock reception signal is maximized.

Figure 2:
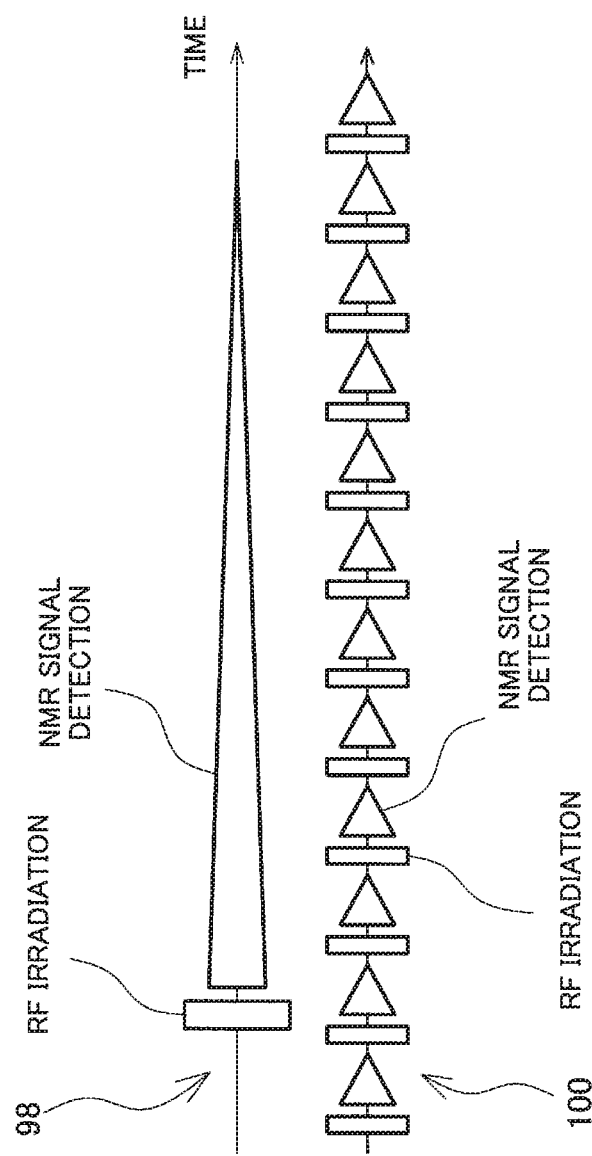
FIG. 2 is a diagram for explaining transmission timing and reception timing.

Referring now to FIG. 2, transmission timing for transmitting RF transmission signals and reception timing for receiving NMR signals (RF reception signals) during the normal NMR measurement will be described. A sequence 98 is used for measuring NMR signals of a sample that is an observation target, and indicates the transmission and reception timing with respect to the HF channel or the LF channel. After transmission of the RF transmission signals to the NMR probe 12 (after RF irradiation), NMR signals (RF reception signals) are received (NMR signal detection) for a predetermined reception period.

A sequence 100, which is a conventional lock sequence, indicates the transmission and reception timing with respect to the LOCK channel. After transmission of lock transmission signals to the NMR probe 12 (after RF irradiation), lock reception signals are received (NMR signal detection) for a predetermined reception period. During the NMR measurement, RF irradiation and NMR signal detection for lock are alternately repeated. Assuming that a period from the start of transmission of a lock signal to the start of transmission of the next lock transmission signal (that is, a period from one RF irradiation to the next RF irradiation) is one cycle, each cycle has the same length in the conventional lock sequence.

Hereinafter, problems that are supposed to arise when the conventional lock sequence is executed will be described. Typically, a LOCK RF line for transmitting lock transmission signals to the NMR probe 12 includes a band-pass filter that blocks signals having frequencies other than the frequency of deuteron ($^2$H nucleus) serving as a lock nucleus to prevent a leak of the lock transmission signals into RF lines used for transmitting other observation RF transmission signals to the NMR probe 12. In some cases, however, acquisition of NMR signals of an observation nucleus having a frequency close to the frequency of deuteron (e.g., $^{29}$Si nucleus) may cause frequency components of deuteron to leak, via the NMR probe 12, to the HF channel or the LF channel and to be observed as noise. In other cases, RF noise components that are output during switching of the T/R switch 86 may be observed as unnecessary signals in the observation band.

For the reasons described above, measurement of an observation nucleus having a frequency closer to that of deuteron (e.g., $^{17}$O nuclei) suffers from a problem in that leaking noise is significant and prohibits use of the lock function. While use of a higher order analog filter may be considered to further attenuate unnecessary frequency components leaking into the band of the observation nucleus, the insertion loss of the filter deteriorates S/N of the lock reception signal or increases the cost.

Nuclei other than $^2$H nucleus (such as $^{19}$F nucleus and $^1$H nucleus) used for lock would suffer from problems similar to those caused by $^2$H nucleus.

During lock, typically, the magnetic field is caused to sweep by sweeping the shim current flowing through shim coil to maximize the intensity of the lock reception signals while repeating transmission of the lock transmission signals and reception of the lock reception signals. In this case, a shift of the static magnetic field beyond the sweep range of the shim current prevents the static magnetic field from being kept uniform by adjustment of the shim current. Expansion of the sweep range of the shim current without changing the sweep time to address the above-described problem would lower the intensity of the lock reception signal to be measured. This may cause erroneous detection of the maximum intensity position of the lock reception signal. Extended sweep time in association with expansion in the sweep range of the shim current would, in turn, increase the time required for lock.

In the present embodiment, the LOCK transmission sequencer 80 controls generation of lock transmission signals based on a pulse sequence generated according to at least one of amplitude modulation, frequency modulation, or phase modulation, to address the above problems. Embodiments for this purpose will be described in detail below.

Embodiment 1

In Embodiment 1, the LOCK transmission sequencer 80 controls the transmission signal generator 82 to generate lock transmission signals such that amplitude modulation (AM modulation) is applied to the lock transmission signals. The transmission signal generator 82, under control of the LOCK transmission sequencer 80, applies amplitude modulation to a lock transmission pulse serving as a lock transmission signal, to thereby blunt the rising edge and the falling edge of the lock transmission pulse. Specifically, the transmission signal generator 82 generates lock transmission pulses having a rising portion and a falling portion whose amplitudes change gently.

Figure 3:
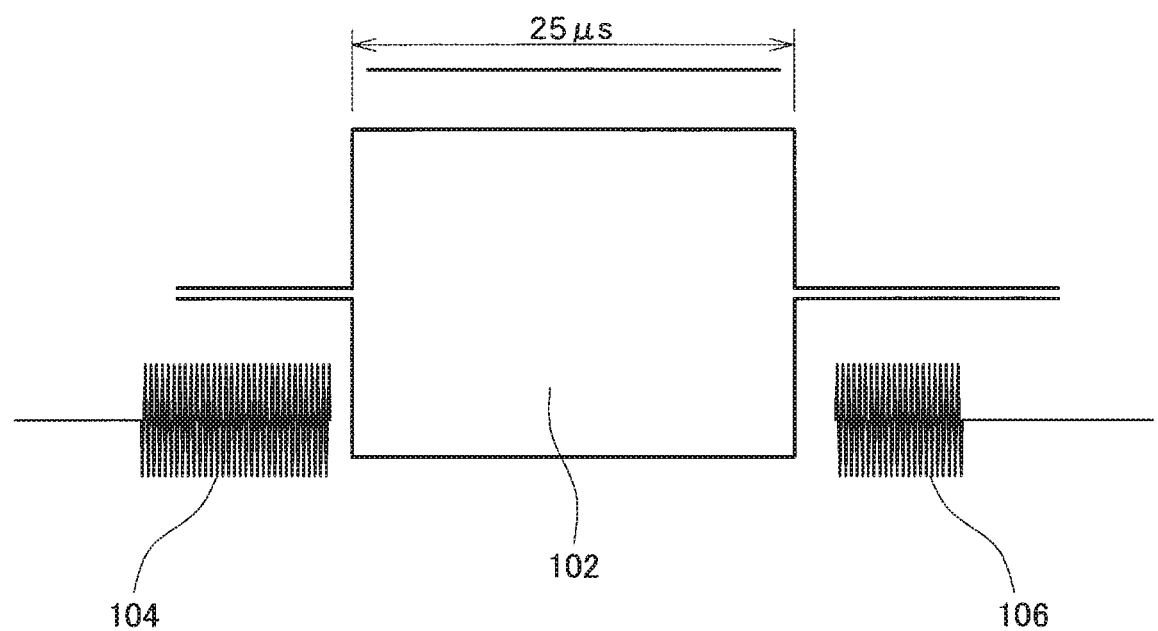
FIG. 3 is a diagram illustrating an example result of observing, by an oscilloscope, a lock transmission pulse to which no amplitude modulation is applied.
Figure 4:
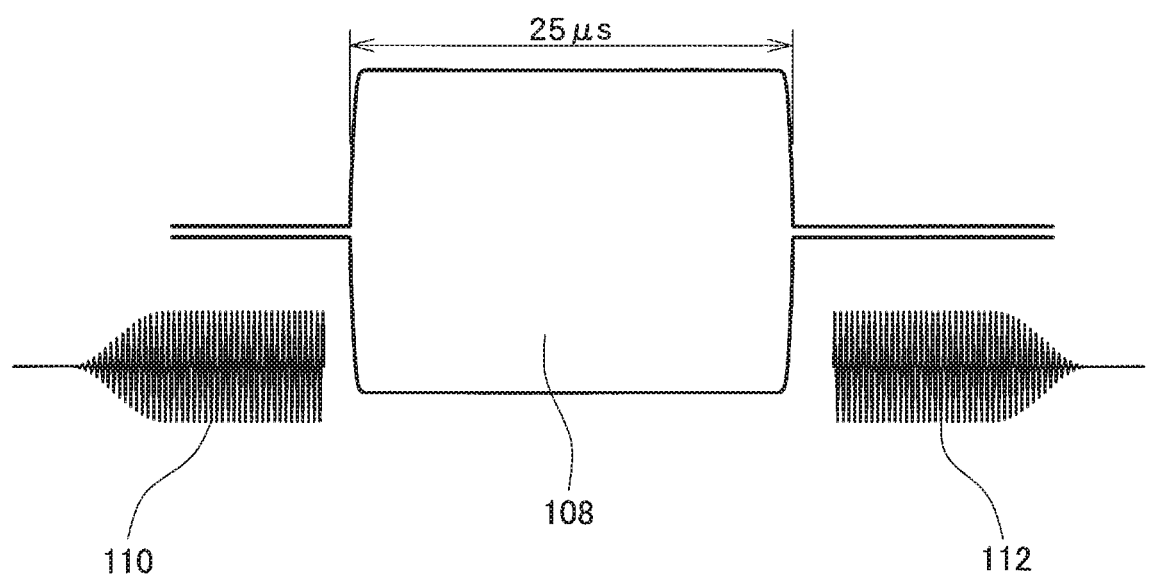
FIG. 4 is a diagram illustrating an example result of observing, by an oscilloscope, a lock transmission pulse to which amplitude modulation is applied.
Figure 5:
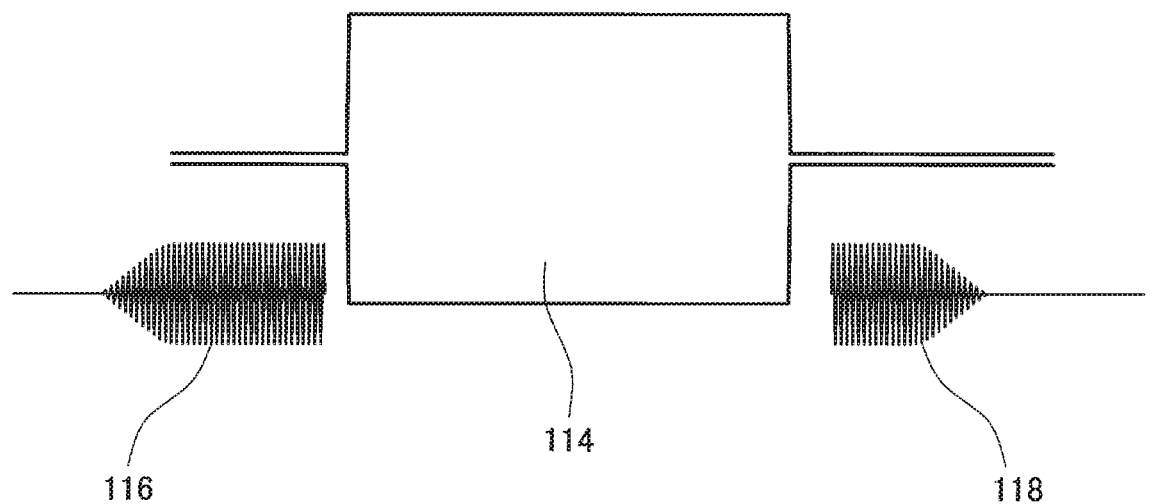
FIG. 5 is a diagram illustrating an example result of observing, by an oscilloscope, a lock transmission pulse passing through a band-pass filter.

Referring to FIG. 3 to FIG. 5, Embodiment 1 will be described in detail. FIG. 3 illustrates an example result of observing, by an oscilloscope, a lock transmission pulse to which no amplitude modulation is applied. FIG. 4 illustrates an example result of observing, by an oscilloscope, a lock transmission pulse to which amplitude modulation is applied. FIG. 5 illustrates an example result of observing, by an oscilloscope, a lock transmission pulse having passed a band-pass filter.

A lock transmission signal is a high-frequency signal having a rectangular wave shape, which is illustrated in FIG. 3 as a lock transmission pulse 102. No amplitude modulation has been applied to the lock transmission pulse 102. The lock transmission pulse 102 has a rising portion 104 whose amplitude abruptly changes (increases) from 0% to 100%. The lock transmission pulse 102 further has a falling portion 106 whose amplitude abruptly changes (decreases) from 100% to 0%.

A lock transmission pulse 108 illustrated in FIG. 4 is generated by applying amplitude modulation to the lock transmission pulse 102 illustrated in FIG. 3. Specifically, the LOCK transmission sequencer 80 causes the transmission signal generator 82 to execute an amplitude modulation instruction to change (increase) the amplitude of the rising portion of the lock transmission pulse 102 over a time period of about 400 ns, for example, from 0% to 100%, and to change (decrease) the amplitude of the falling portion of the lock transmission pulse 102, over a time period of about 400 ns, for example, from 100% to 0%. In other words, the LOCK transmission sequencer 80 causes the amplitude of the rising portion of the lock transmission pulse 108 to change from 0% to 100% more gently than the amplitude of the rising portion 104 of the lock transmission pulse 102, and causes the amplitude of the falling portion of the lock transmission pulse 108 to change from 100% to 0% more gently than the amplitude of the falling portion 106 of the lock transmission pulse 102. The lock transmission pulse 108 has the rising portion 110 whose amplitude has been changed over a time period of about 400 ns, for example, from 0% to 100%, and has the falling portion 112 whose amplitude has been changed over a time period of about 400 ns, for example, from 100% to 0%. Blunting the change of the lock transmission pulse in the rising portion and the falling portion as described above can narrow the spectrum band of the lock transmission pulse. This can further reduce unnecessary signals caused by lock signals that are observed at the HF channel or the LF channel. The numeral values described above are only examples; other numeral values may be adopted.

A lock transmission pulse 114 illustrated in FIG. 5 is generated by causing the lock transmission pulse 102 illustrated in FIG. 3 to pass a band-pass filter that allows signals with RF frequencies to pass therethrough as its pass band. The lock transmission pulse 114 includes a rising portion 116 whose amplitude changes from 0% to 100% more gently than the rising portion 104 of the lock transmission pulse 102. The lock transmission pulse 114 also includes a falling portion 118 whose amplitude changes from 100% to 0% more gently than the amplitude of the falling portion 106 of the lock transmission pulse 102.

Application of amplitude modulation to the lock transmission pulse 102 as described above results in a spectrum with large attenuation in side lobes, as can be obtained by application of a band-pass filter to the lock transmission pulse 102, without using a band-pass filter. This structure prevents loss caused by the use of a band-pass filter and also prevents an increase in cost.

Advantages of amplitude modulation will be described below.

Figure 6:
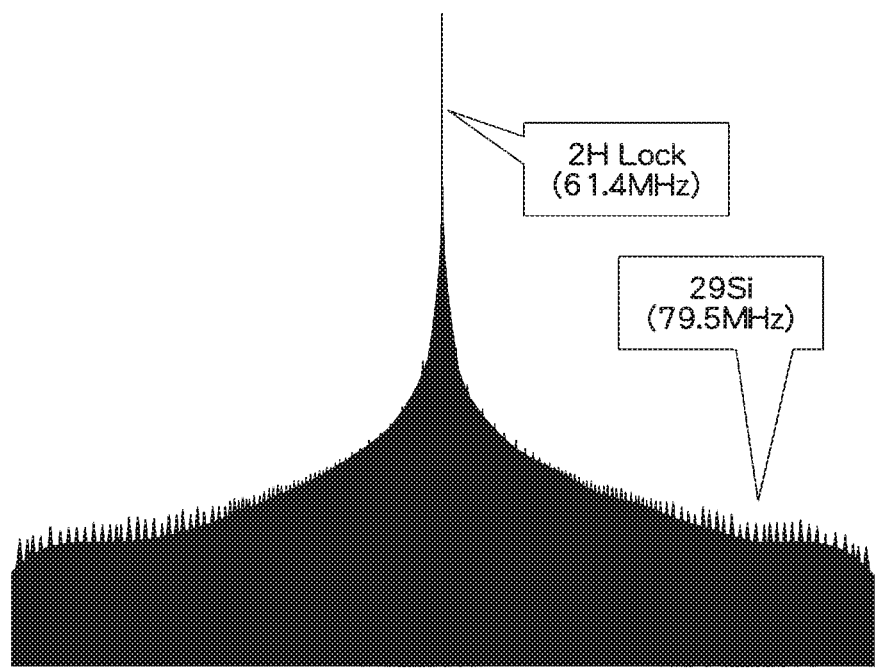
FIG. 6 is a diagram illustrating an example result of observing, by a spectrum analyzer, a lock transmission pulse to which no amplitude modulation is applied.

FIG. 6 illustrates an example result of observing, by a spectrum analyzer, a lock transmission pulse to which no amplitude modulation is applied. A lock transmission pulse, which is a pulse with a rectangular shape, has a feature having a wide band with the frequency of $^2$H nucleus at the center (sinc function). The frequency components of $^{29}$Si nucleus that have not been removed by a band-pass filter are observed as noise.

Figure 7:
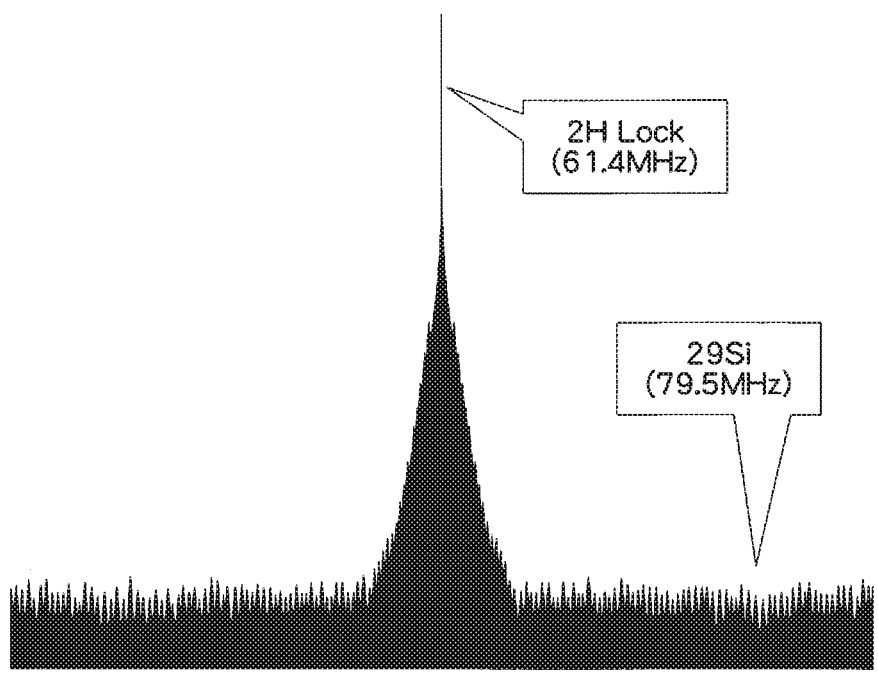
FIG. 7 is a diagram illustrating an example result of observing, by a spectrum analyzer, a lock transmission pulse to which amplitude modulation is applied.

FIG. 7 illustrates an example result of observing, by a spectrum analyzer, a lock transmission pulse to which amplitude modulation is applied. The lock transmission pulse has a spectrum band that is narrowed (a narrow spectrum band) by blunting a rising portion and a falling portion of the lock transmission pulse by amplitude modulation, without using a band-pass filter.

Figure 8:
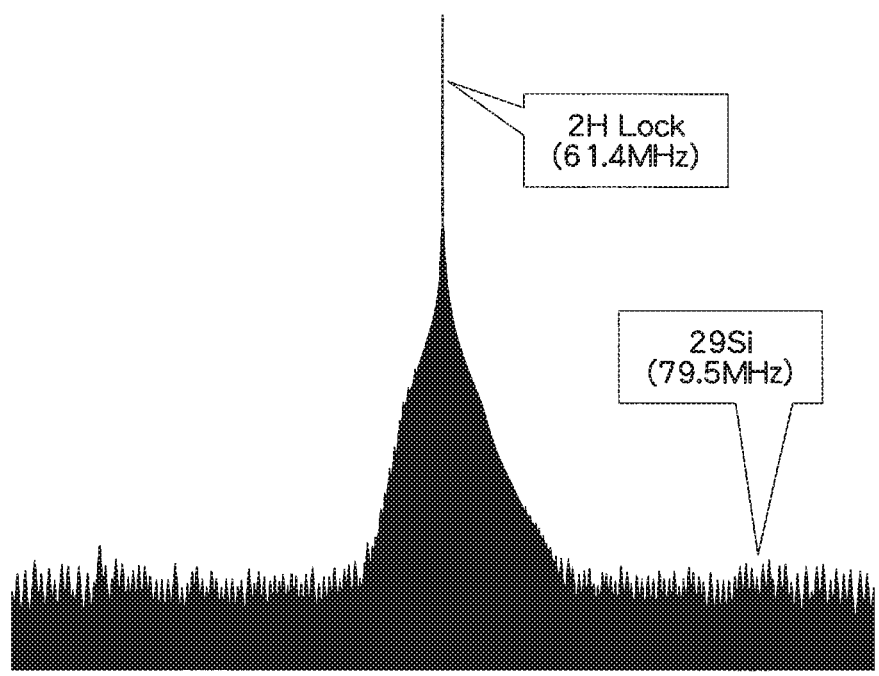
FIG. 8 is a diagram illustrating an example result of observing, by a spectrum analyzer, a lock transmission pulse to which a band-pass filter is applied.

FIG. 8 illustrates an example result of observing, by a spectrum analyzer, a lock transmission pulse to which a band-pass filter is applied. The lock transmission pulse has a spectrum band that is narrower than that of the lock transmission pulse illustrated in FIG. 6. As described above, the spectrum band can be narrowed by making a rising portion and a falling portion gentle by application of amplitude modulation. This mechanism will be described below.

Figure 9:
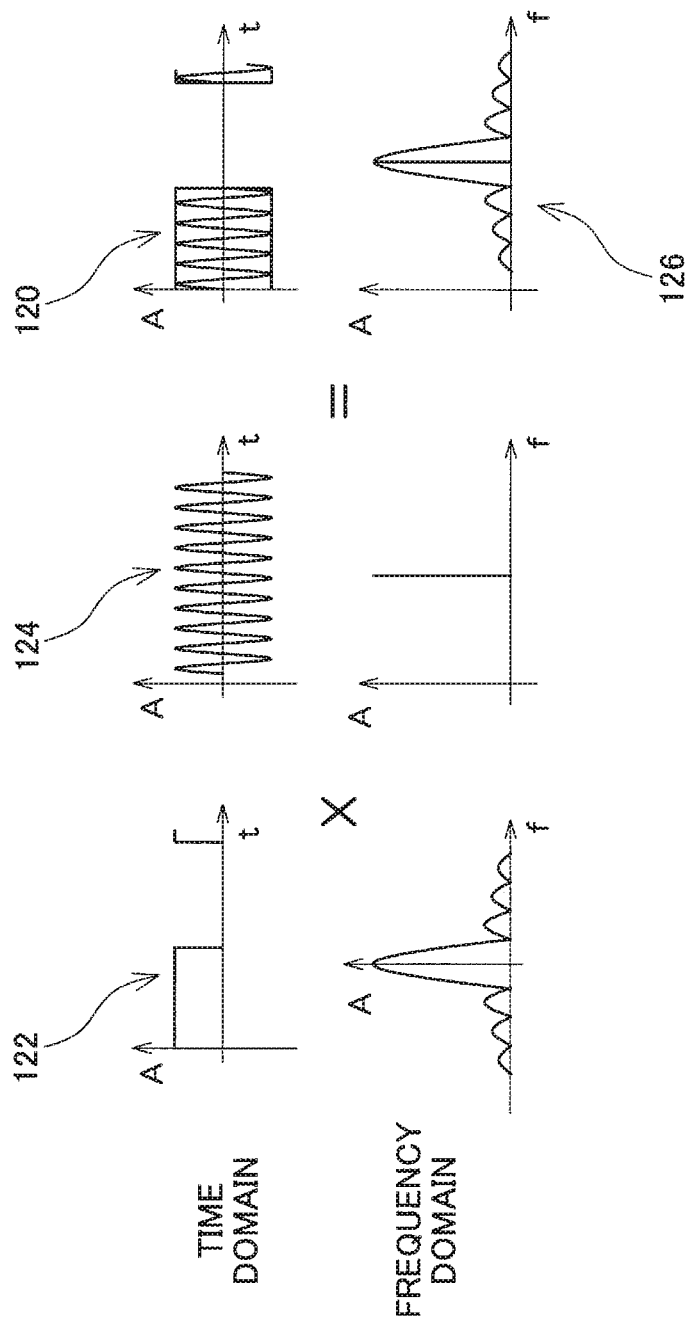
FIG. 9 is a diagram illustrating example lock transmission pulses and spectrums.

As illustrated in FIG. 9, a lock transmission pulse 120 is a signal obtained by multiplying a rectangular wave 122 by a high frequency continuous wave signal 124. The lock transmission pulse 120 has a spectrum (frequency domain) 126 with a spread band having absolute values of the sinc function with a high frequency at the center.

Figure 10:
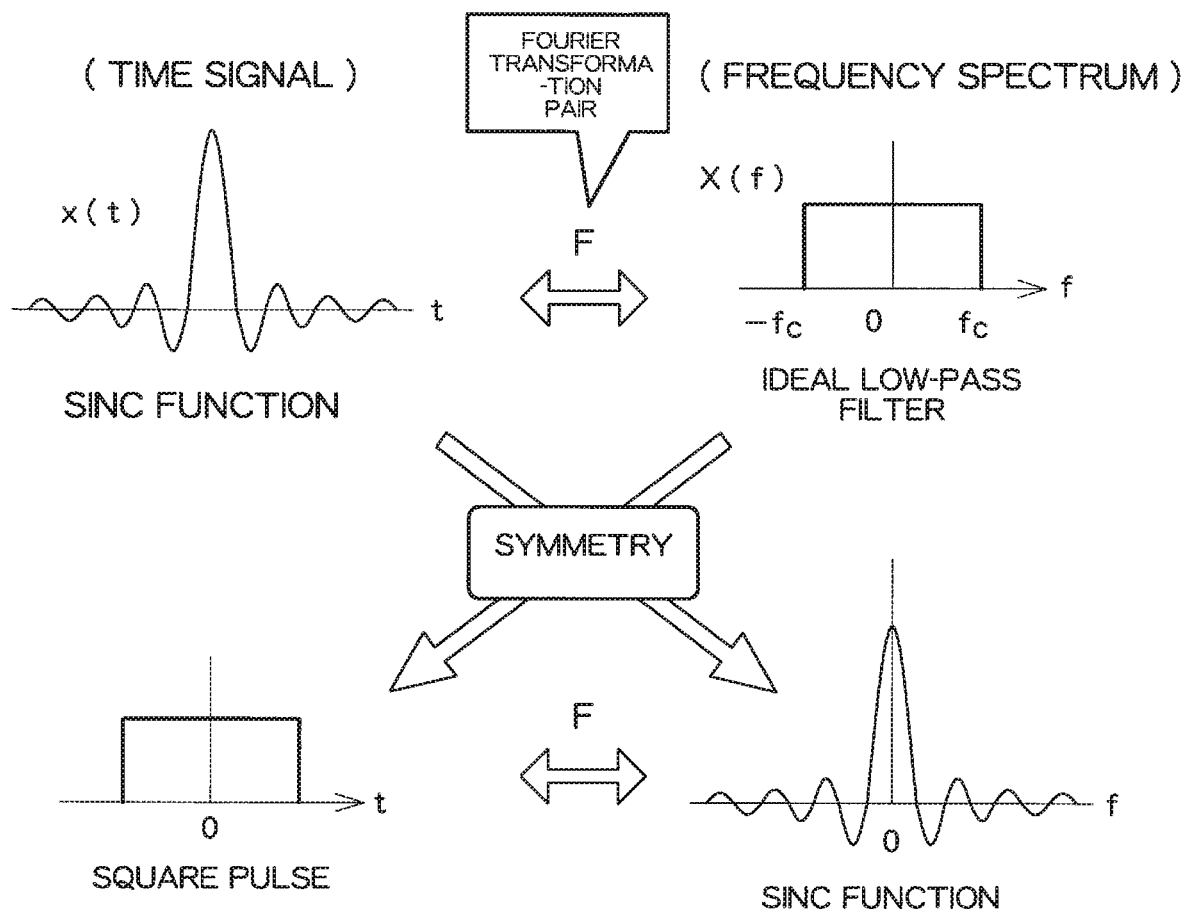
FIG. 10 is a diagram for explaining a relationship between a rectangular wave and the sinc function.

As illustrated in FIG. 10, a rectangular wave and the sinc function have symmetry; a waveform of the sinc function in time domain corresponds to a spectrum with unspread square band in frequency domain.

Figure 11:
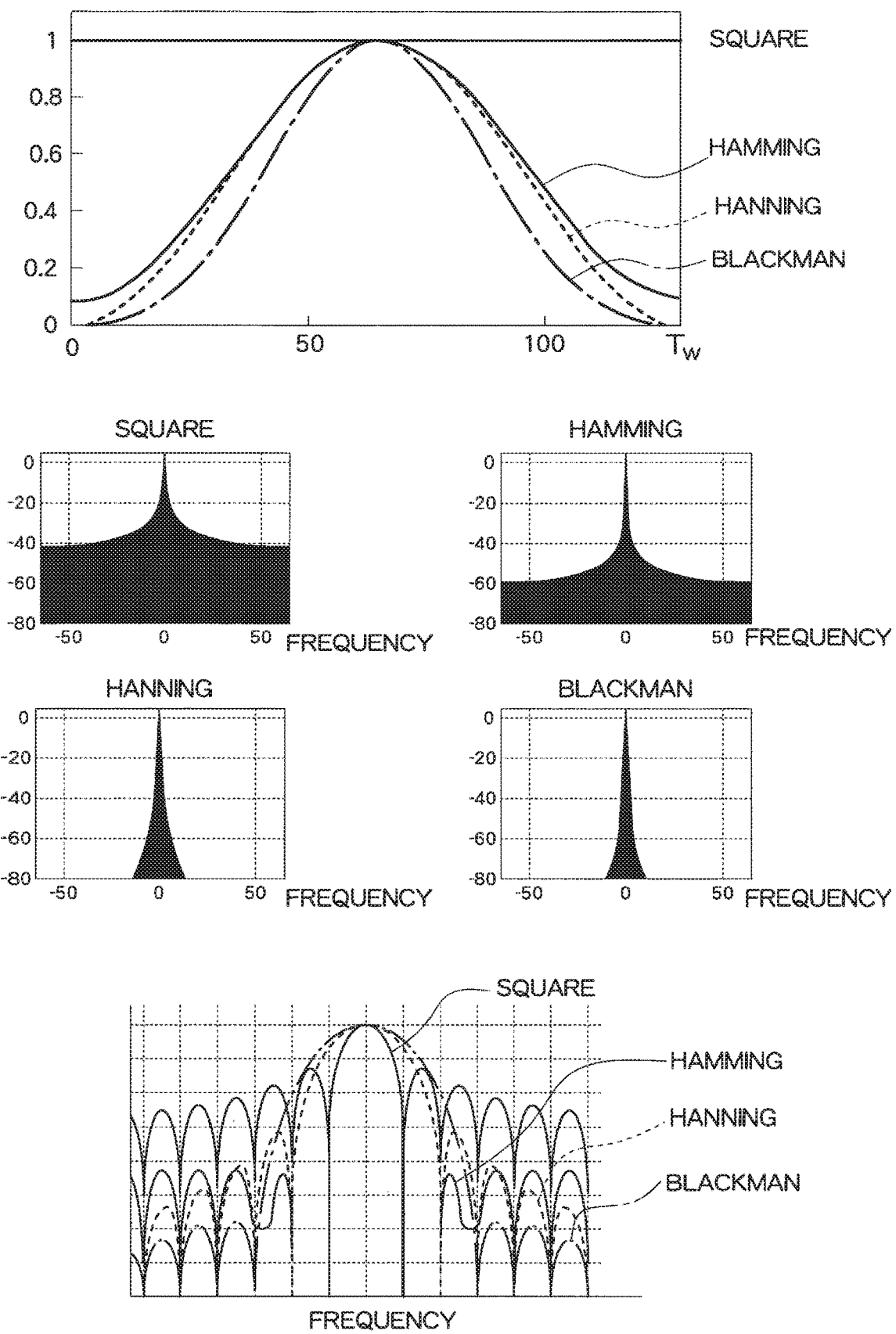
FIG. 11 is a diagram for explaining characteristics of various window functions.

The lock transmission pulse is also regarded to be equivalent to a square window in the window function that is used as a process before Fourier transformation. As illustrated in FIG. 11, while a square window has a spectrum having side lobes with small attenuation, waveforms having gentle rising and falling edges in time axis waveforms, such as a Hanning window, a Hamming window, and a blackman window, have side lobes with larger attenuation than the side lobes of the square wave.

As described above, the wide spread band of a lock transmission pulse having a rectangular wave shape can be restricted by making the rising portion and the falling portion of the lock transmission pulse gentle.

Embodiment 2

In Embodiment 2, the LOCK transmission sequencer 80 variably controls transmission timing for transmitting lock transmission signals. Specifically, the LOCK transmission sequencer 80 varies the transmission timing for each lock transmission signal. More specifically, the LOCK transmission sequencer 80 sets a waiting period after a reception period for receiving lock reception signals and controls transmission of the lock transmission signals such that the next lock transmission signal is to be transmitted after the waiting period. The LOCK transmission sequencer 80 varies the waiting period each time the lock transmission signal is transmitted.

Figure 12:
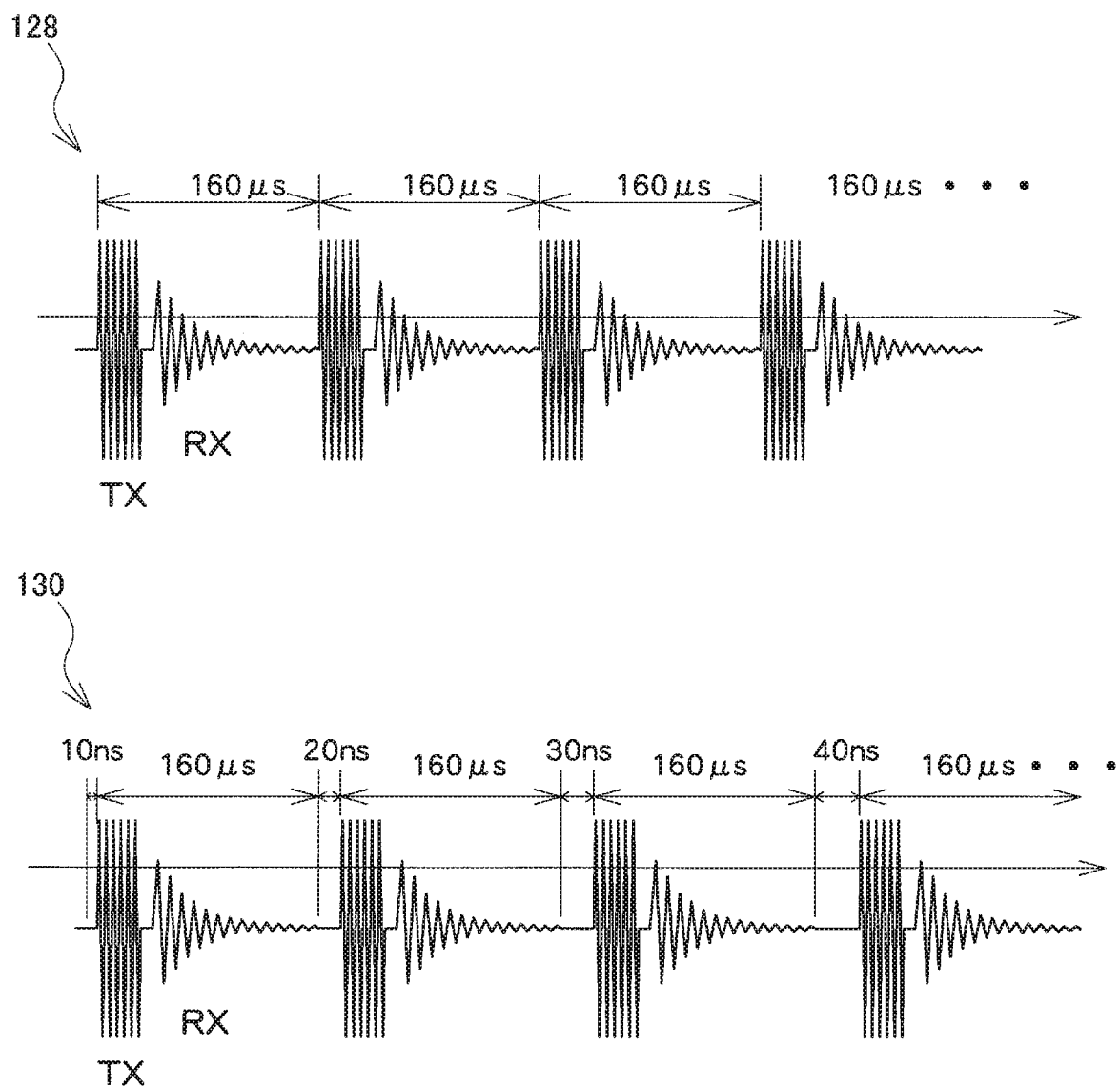
FIG. 12 is a diagram illustrating an example lock sequence.

Referring to FIG. 12, Embodiment 2 will be described in detail. FIG. 12 illustrates a conventional lock sequence 128 and a lock sequence 130 of Embodiment 2.

The conventional sequence 128 will be described first. The conventional sequence 128 is the same as the lock sequence 100 illustrated in FIG. 2. TX in FIG. 12 denotes a transmission period for transmitting lock transmission signals and RX denotes a reception period for receiving lock transmission signals. In the conventional sequence 128, after transmission of a lock transmission signal, a lock reception signal is received for a reception period RX, and after the reception period RX, the next lock transmission signal is transmitted. During NMR measurement, transmission (TX) and reception (RX) are alternately performed repeatedly in this manner. Assuming that a period composed of one TX and one RX is defined as one cycle; that is, assuming that a period from the start of transmission of a lock transmission signal to the start of transmission of the next lock transmission signal is defined as one cycle, each cycle of the conventional lock sequence 128 is uniform. An example length of one cycle (period) is 160 µs. When each cycle has a uniform length, RF noise components that are output when switching the T/R switch 86 may be observed as unnecessary signals, as described above.

In the sequence 130 of Embodiment 2, a waiting time is set before transmission of the lock transmission signal. The initial value of the waiting time, which is set to 10 ns, for example, is incremented for each one cycle. Upon reaching a predetermined value (e.g., 1000 ns), the value is returned to 10 ns, and then incremented again. In the example illustrated in FIG. 12, the waiting times of 10 ns, 20 ns, 30 ns, 40 ns, and so on, are set. The waiting time that is varied for each cycle varies the transmission timing for transmitting the lock transmission signal among each cycle. This further varies the timing for generating noise in the T/R switch 86 for each cycle, resulting in dispersion of the noise. Thus, it is possible to distribute frequency components of unnecessary signals to reduce the noise to be observed in the NMR signal observation channel.

The numeral values described above are only examples, and other values may be used.

Embodiment 3

While the waiting time in the sequence 130 of Embodiment 2 is incremented for each cycle, in Embodiment 3, the LOCK transmission sequencer 80 may change the waiting time as desired. For example, the LOCK transmission sequencer 80 may determine the minimum value (e.g., 10 ns) and the maximum value (e.g., 1000 ns) of the waiting time and generate and set as the waiting time a random number between the minimum value and the maximum value for each cycle. This varies the length of the waiting time for each cycle randomly. The waiting time that is changed in this manner also shifts the transmission timing for transmitting the lock transmission signal for each cycle. This results in dispersion of the noise generated in the T/R switch 86 and distribution of frequency components of unnecessary signals to reduce the noise to be observed in the NMR signal observation channel.

Embodiment 4

In Embodiment 4, spread frequency (spread spectrum) is applied to a system clock of the LOCK transmission sequencer 80, which varies the transmission timing for transmitting the lock transmission signal for each lock transmission signal. The spread frequency may be applied to the system clock by the spectrometer control computer 24 or by the host computer 14. One of the direct sequence system ((DS) system), the frequency hopping system ((FH) system), and the hybrid system (DS/FH system) is used as a spread frequency system.

In Embodiment 4, similar to Embodiments 2 and 3, the transmission timing for transmitting the lock transmission signal varies for each cycle. This results in dispersion of the noise generated in the T/R switch 86 and distribution of frequency components of unnecessary signals to reduce the noise to be observed in the NMR signal observation channel.

Embodiment 5

In Embodiment 5, the LOCK transmission and reception unit 42 and the observation channel 22 (LOCK channel) are used for NMR signal observation, not for lock, and the LOCK transmission sequencer 80 executes a sequence for NMR signal observation. The LOCK transmission sequencer 80 transmits to the observation channel 22 (LOCK channel) a wide band pulse called WURST (Wideband Uniform Rate and Smooth Truncation) sequence generated according to a combination of amplitude modulation and phase modulation, for example, as a transmission signal.

Figure 13:
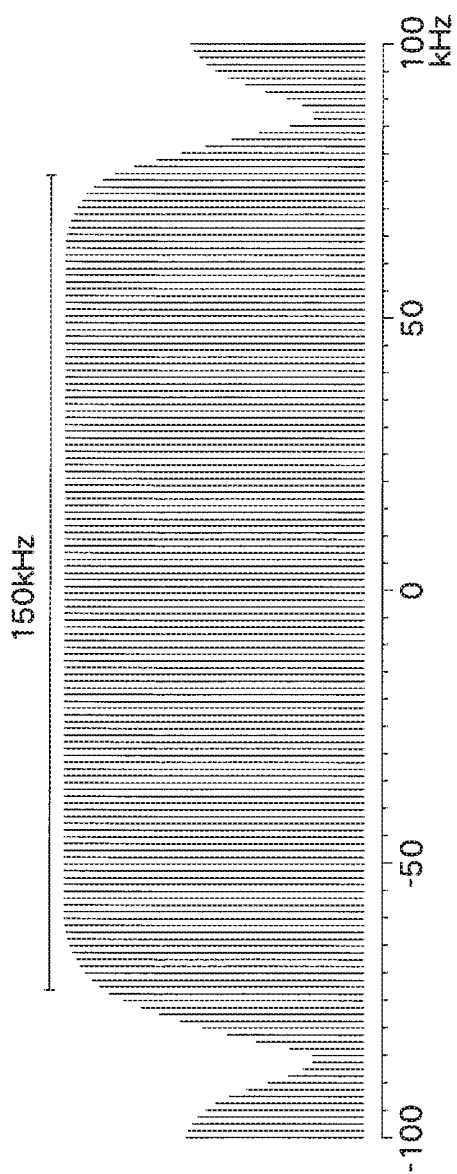
FIG. 13 is a diagram illustrating an example WURST decoupling profile.

The WURST sequence is typically used for wideband decoupling, and applies amplitude modulation and phase modulation to a transmission pulse having a rectangular shape. FIG. 13 illustrates an example WURST decoupling profile.

The mechanism of the WURST sequence of transmitting RF transmission signals in a wide band as described above enables calculation of the amount of shim adjustment.

Specifically, the LOCK transmission sequencer 80 transmits RF transmission signals in accordance with the WURST sequence and converts the position (frequency shift) of an NMR signal that is observed to a shift amount (an amount of shim adjustment) of the static magnetic field to correct the magnetic field with the adjustment amount.

Embodiment 5 enables determination of the shim adjustment amount even when the static magnetic field is shifted significantly. Embodiment 5 further eliminates the need for sweeping the magnetic field, thus enabling lock operations in a shorter time than in conventional methods.

Embodiment 6

In Embodiment 6, the LOCK transmission and reception unit 42 and the observation channel 22 (LOCK channel) are used for NMR signal observation and for decoupling, not for lock, and the LOCK transmission sequencer 80 executes NMR signal observation sequence and decoupling sequence.

For example, execution of a pulse sequence for 3-nucleus measurement using the HF channel, the LF channel, and the LOCK channel results as follows: a hydrogen nucleus ($^{1}$H nucleus) or a fluorine nucleus ($^{19}$F nucleus) is observed in the HF channel; a nucleus having a resonance frequency that is equal to or lower than the frequency of a phosphorus nucleus ($^{31}$P nucleus), such as one of $^{13}$C nucleus, $^{15}$N nucleus, $^{29}$Si nucleus, and $^{31}$P nucleus, is observed in the LF channel; and deuteron ($^{2}$H) is observed in the LOCK channel.

As described above, in the present embodiments, in which the LOCK transmission sequencer 80 and the LOCK reception sequencer 88 are mounted in the LOCK transmission and reception unit 42, a pulse sequence similar to that executed by the NMR signal observation sequencer can be executed using the LOCK channel. This structure increases the degree of freedom of the LOCK channel. Execution of Embodiments 1 to 6 described above can address various issues.

For example, according to Embodiment 1, it is possible to reduce unnecessary signals resulting from lock signals observed in the NMR signal observation channel. Execution of Embodiment 2, 3 or 4 diffuses noise caused by the T/R switch 86 to disperse frequency components of the unnecessary signals, thereby reducing noise observed in the NMR signal observation channel. Further, use of lock enables measurements of nuclei closer to a lock nucleus (deuteron), which conventional methods were not able to realize because of large leaking noise. Also, the LOCK channel can be used for usage other than lock, as in Embodiments 5 and 6, thus increasing the degree of freedom of the LOCK channel.

The invention claimed is:

1. A nuclear magnetic resonance (NMR) apparatus, comprising:
   a lock transmission and reception circuit configured to transmit a lock transmission signal that excites a lock nucleus used for observing a change in a static magnetic field for nuclear magnetic resonance measurement to an NMR probe and to receive an NMR signal of the lock nucleus from the NMR probe; and
   a lock sequencer connected with the lock transmission and reception circuit, the lock sequencer controlling generation of the lock transmission signal based on a pulse sequence generated according to at least one of amplitude modulation, frequency modulation, or phase modulation
   wherein the lock sequencer is configured to variably control transmission timing for transmitting the lock transmission signal, and
   the lock transmission and reception circuit includes:
      a lock transmission circuit configured to transmit the lock transmission signal, via a transmission and reception switching circuit, to the NMR probe; and
      a lock reception circuit configured to receive an NMR signal of the lock nucleus from the NMR probe via the transmission and reception switching circuit, wherein
      the transmission and reception switching circuit is a switch configured to change a connection target between a transmission instance and a reception instance by connecting the lock transmission circuit with the NMR probe during the transmission instance and connecting the lock reception circuit with the NMR probe during the reception instance, and
   the lock sequencer is configured to vary the transmission timing for each lock transmission signal.

2. The nuclear magnetic resonance apparatus according to claim 1, wherein
   the lock transmission signal is a pulsed signal, and
   the lock sequencer is configured to control application of amplitude modulation to the lock transmission signal to blunt a rising portion and a falling portion of the lock transmission signal.

3. The nuclear magnetic resonance apparatus according claim 1, wherein
   the lock sequencer is configured to set a waiting period after a reception period of the NMR signal of the lock nucleus and to control the lock transmission circuit to transmit the lock transmission signal after the waiting period, the lock sequencer changing the waiting period for each transmission instance of transmitting the lock transmission signal.

4. The nuclear magnetic resonance apparatus according to claim 3, wherein
   the lock sequencer is configured to change a length of the waiting period randomly for each transmission instance of transmitting the lock transmission signal.

5. The nuclear magnetic resonance apparatus according claim 1, wherein
   the lock sequencer is configured to change the transmission timing for transmitting the lock transmission signal for each lock transmission signal when spread frequency is applied to a system clock of the lock sequencer.

6. The nuclear magnetic resonance apparatus according to claim 1, wherein
   the lock sequencer is further configured to control transmission of a transmission signal including a wideband pulse.

7. The nuclear magnetic resonance apparatus according to claim 1, wherein
   the lock sequencer is further configured to control transmission of a transmission signal for decoupling.

* * * * *